United States Patent [19]

Muraoka et al.

[11] Patent Number: 5,575,059

[45] Date of Patent: Nov. 19, 1996

[54] TAPE CARRIER PACKAGE MOUNTING APPARATUS WITH HEATERS FOR BONDING TOOLS

[75] Inventors: Nobuhiko Muraoka, Toyonaka; Nobuhisa Watanabe, Kobe; Shinjiro Tsuji, Hirakata; Ikuko Obata, Osaka, all of Japan

[73] Assignee: Matsushita Electric Industrial Co., Ltd., Osaka-fu, Japan

[21] Appl. No.: 447,048

[22] Filed: May 22, 1995

[30] Foreign Application Priority Data

May 24, 1994 [JP] Japan .................................. 6-109280

[51] Int. Cl.⁶ .............................. H05K 3/34; B23P 19/04
[52] U.S. Cl. .............................. 29/740; 29/743; 228/6.2; 294/64.1
[58] Field of Search .................................. 29/51, 52, 54, 29/709, 740, 743, 760, 806, DIG. 44; 156/583.1; 219/85.16, 541; 228/4.5, 5.5, 6.2, 180.21; 294/2, 64.1

[56] References Cited

U.S. PATENT DOCUMENTS

| | | | |
|---|---|---|---|
| 3,774,834 | 11/1973 | Holler et al. | 228/5.5 |
| 4,315,128 | 2/1982 | Matcovich et al. | 228/4.5 X |
| 4,381,601 | 5/1983 | Tanai et al. | 29/740 |
| 4,881,319 | 11/1989 | Yagi et al. | 228/6.2 X |
| 5,006,197 | 4/1991 | Newkirk et al. | 156/583.1 X |
| 5,397,423 | 3/1995 | Bantz et al. | 29/743 X |

FOREIGN PATENT DOCUMENTS 200541  8/1988  Japan ..................................... 228/6.2

OTHER PUBLICATIONS

IBM Technical Disclosure Bulletin, vol. 37, No. 4A, Apr. 1994, pp. 159–160.

*Primary Examiner*—Peter Vo
*Attorney, Agent, or Firm*—Wenderoth, Lind & Ponack

[57] ABSTRACT

A TCP mounting apparatus includes a tool storing and holding section having arranged therein a plurality of different kinds of bonding tools which suction tape carrier packages of respective different shapes to heat and pressure bond the tape carrier packages to a liquid crystal panel. The bonding tools are stored at predetermined positions within the tool storing and holding section, and the tool storing and holding section includes a heater for heating the stored and held bonding tools and detector for detecting a presence and absence of the stored bonding tools at each position. A head part is also provided for extracting any selected one of the bonding tools stored and held in the tool storing and holding section. The head part also includes a heater for heating an extracted bonding tool. A conveyor mechanism moves and positions the head part to the predetermined positions of the tool storing and holding section.

2 Claims, 7 Drawing Sheets

TAPE CARRIER PACKAGE MOUNTING APPARATUS WITH HEATERS FOR BONDING TOOLS

BACKGROUND OF THE INVENTION

The present invention relates to an apparatus for mounting tape carrier packages to liquid crystal panels. The tape carrier package ("TCP" hereinafter) is a type of package in which ICs are loaded on a continuous film-like tape carrier.

Recently display devices utilizing liquid crystal are more often used in personal computers, word processors and the like, whereby high efficiency of TCP mounting equipment to mount TCPs to liquid crystal panels is required.

Conventional examples of TCP mounting equipment will be described with reference to FIGS. 3–6.

Figure 3:
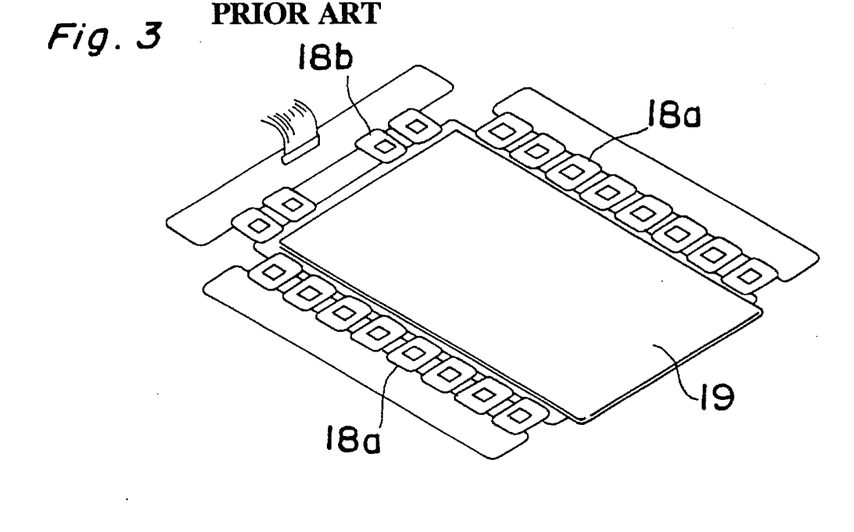
FIG. 3 is a perspective view of a liquid crystal panel and TCPs.

FIG. 3 illustrates a state where TCPs 18a and TCPs 18b are arranged respectively along the longer sides and the shorter side of a liquid crystal panel 19.

Due to the difference in shape between the TCPs 18a and 18b, two kinds of bonding tools are needed respectively corresponding to the different shapes of the TCPs in the arrangement of FIG. 3. That is, a bonding tool for the TCP 18a along the longer sides and another bonding tool for the TCP 18b along the shorter side are necessary.

Figure 4:
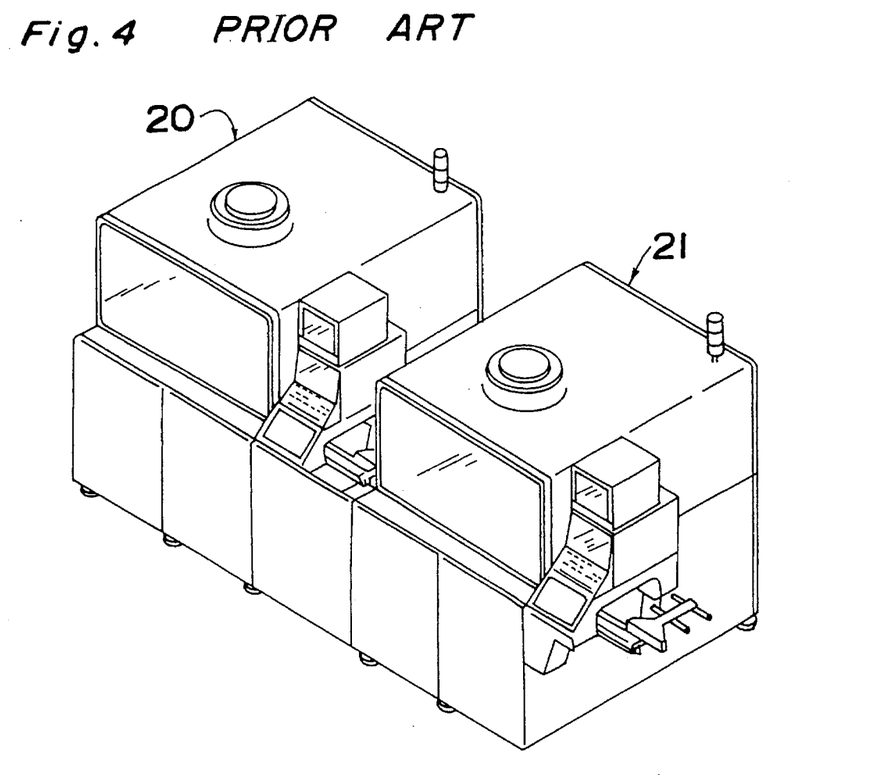
FIG. 4 is a perspective view of a first conventional example.

More specifically, according to the first conventional example, as shown in FIG. 4, two TCP mounting apparatuses 20 and 21, i.e., TCP mounting apparatus 20 for the longer TCP and TCP mounting apparatus 21 for the shorter TCP are set side by side.

Figure 5:
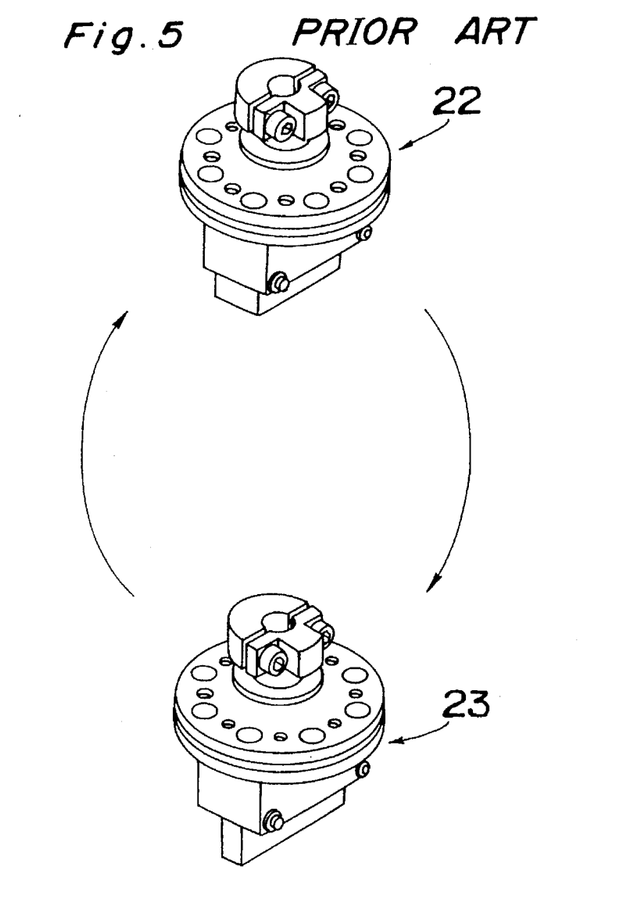
FIG. 5 is a perspective view of a main part of a second conventional example.

In a second conventional example, as indicated in FIG. 5, either one of mounting heads 22 and 23 for the longer TCP, respectively, and shorter TCP is first installed in a single TCP mounting apparatus. After the longer or shorter TCPs are mounted to not less than a certain number of liquid crystal panels, the mounting head is exchanged to mount the other of the shorter or longer TCPs.

Figure 6:
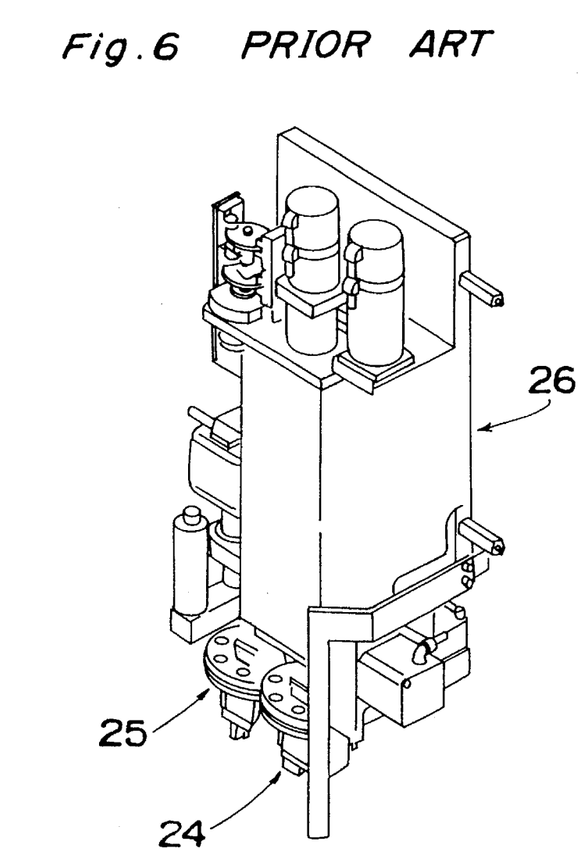
FIG. 6 is a perspective view of a main part of a third conventional example.

A third example of FIG. 6 also uses a single TCP mounting apparatus, similar to the second example as above. A mounting head 24 for the longer TCP and a mounting head 25 for the shorter TCP are set together in a head section 26 of the TCP mounting apparatus.

Every conventional arrangement has drawbacks.

In the first example, when different kinds of TCPs are to be mounted to a liquid crystal panel, the cost of the equipment approximately doubles, impeding the reduction of any mounting cost.

In the second example, in order to mount TCPs of different kinds, the mounting heads should be exchanged while the equipment is temporarily stopped, thus consuming much time not only for the exchange of the heads, but for regulating the parallelism or the like of the head after the exchange. Moreover, since heating of the bonding tool to a bonding temperature after the exchange of mounting heads takes time, the productivity decreases.

In the third example, if another bonding tool is attached to the head section so as to mount a different kind of TCP there are present in one head section two sets of a suction means, a heating source, a moving means, etc. which are included in each bonding tool. The head section becomes complicated in structure and increases in weight, and is therefore unfit for high-speed mounting. An improvement in productivity is obstructed.

SUMMARY OF THE INVENTION

An object of the present invention is therefore to provide a TCP mounting apparatus whereby different kinds of TCPs are mounted to a liquid crystal panel at high speeds in a short time using a simple head section structure in a single equipment.

In accomplishing these and other objects, according to one aspect of the present invention, there is provided a TCP mounting apparatus comprising:

a tool storing and holding section wherein are arranged a plurality of kinds of bonding tools which suck tape carrier packages of respective specific shapes to transfer and then bond the tape carrier packages with heat and pressure to a liquid crystal panel, a storing and holding means for storing and holding the bonding tools at predetermined storing and holding positions of the tool storing and holding section, a heating means for heating the stored and held bonding tools, and detecting means for detecting a presence and absence of the stored bonding tools in each storing and holding means;

a head part which is provided with an exchanging and holding means for extracting one of the bonding tools stored and held in the tool storing and holding section and holding the extracted bonding tool in an exchangeable fashion, and a heating means for heating the bonding tool held by the exchanging and holding means; and a moving and positioning means for moving and positioning the head part to a predetermined position.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Before the description of the present invention proceeds, it is to be noted that like parts are designated by like reference numerals throughout the accompanying drawings.

A TCP mounting apparatus in one preferred embodiment of the present invention will be discussed below with reference to FIGS. 1–3 and 7–10.

A head part 1 will be first described. The head part 1 holds one of bonding tools 2a, 2b by means of tool chucking hooks 3 which serve as one example of an exchanging and holding means. One of the bonding tools 2a, 2b held by the chucking hooks 3 of the head part 1 is heated by the heat from a heat conduction means 4, thereby sucking a TCP and pressure-bonding the sucked TCP to a liquid crystal panel. The heat conduction means 4 is heated by a heating means such as a heater 93 in FIG. 10 or the like. The contact face between the heat conduction means 4 and the bonding tool 2a or 2b is flat so as to avoid generating a point contact, so that the heat is conducted favorably.

A tool change station section 5 which serves as one example of a tool storing and holding section will now be described with reference to FIGS. 1–3. As shown in FIG. 3, since the TCP 18a at the longer side of the liquid crystal panel 19 is different in length and shape from the TCP 18b at the shorter side of the liquid crystal panel 19, the first bonding tool 2a for the TCP 18a is made different in length and shape from the second bonding tool 2b for the shorter TCP 18b. The first bonding tool 2a is kept at a first bonding tool station 6 which serves as one example of a storing and holding means. On the other hand, the second bonding tool 2b is supported at a second bonding tool station 7 which serves as one example of a storing and holding means. Detecting sensors 8a, 8b of the station section 5 such as a pair of optical sensors of transmission type confirm the presence and absence of the TCPs 18a, 18b, respectively and utilize the confirmation as a reference to order an action and to prevent an erroneous operation. The station section 5 is also provided with a heating means 9 for heating the TCPs 18a, 18b to a temperature close to the bonding temperature at all times. A flange 10 of each bonding tool 2a, 2b is fitted in grooves 11 formed in the station section 5 to support the bonding tool 2a, 2b at the station section 5. Ball plungers 12 retain the thus-fitted tool 2a, 2b into each of the grooves 11. One of the ball plungers 12 is clearly shown in FIG. 9. A ball 90 pressed by a spring 91 in the station section 5 can be pressed and inserted into a recess 10a of the lower surface of the flange 10 of each bonding tool 2a, 2b to hold the flange 10 in each groove 11.

Figure 10:
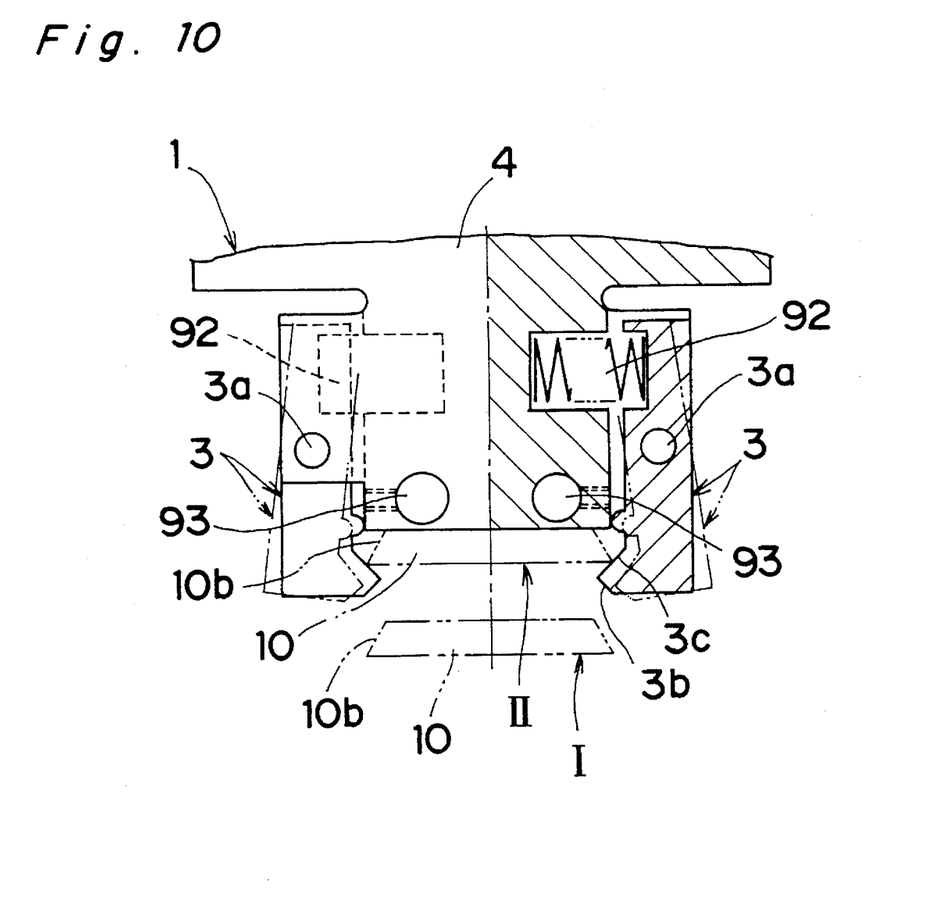
FIG. 10 is a partially sectional view of a head in the TCP mounting apparatus in the embodiment.

As shown in FIG. 10, the chucking hooks 3 are pivotably supported by pins 3a on the heat conduction means 4 and are urged by springs 92 in the heat conduction means 4 so that the chucking hooks 3 are close to each other around the pins 3a as shown by solid lines in FIG. 10. The chucking hooks 3 can be pivoted around the pins 3a against the urging forces of the springs 92 as shown by chain-dotted lines in FIG. 10. Each chucking hook 3 has at its lower end inner and outer inclined surfaces 3a and 3b capable of contacting an inclined surface 10a of the flange 10 of each bonding tools 2a, 2b. That is, when the chucking hooks 3 holds one of the bonding tools 2a, 2b, the head part 1 moves downwardly towards the station section 5 and then the outer inclined surfaces 3b of the chucking hooks 3 contact the inclined surfaces 10a of the flange 10 of the desired bonding tool 2a or 2b in the station section 5 and then slide thereon to pivot the chucking hooks 3 around the pins 3a against the urging forces of the springs 92 to open the chucking hooks 3 as shown by chain-dotted lines in FIG. 10. Thus, the flange 10 is inserted into the space between the lower ends of the chucking hooks 3 and the chucking hooks 3 pivot around the pins 3a by the urging forces of the springs 92 to be close to each other so as to clamp the bonding tool while the inner inclined surfaces 3c of the chucking hooks 3 contact the lower edges of the flange 10 as shown by reference character II in FIG. 10. Then, the head part 1 together with the clamped bonding tool turns 90° to disengage the flange 10 of the bonding tool from the grooves 11 and moves upwardly while holding the desired bonding tool. On the other hand, when the chucking hooks 3 release the holding bonding tool, the head part 1 moves downwardly towards the station section 5 and then the head part 1 turns 90° to engage the flange 10 of the bonding tool with the grooves 11 and moves upwardly while the flange 10 of the bonding tool is engaged with the grooves 11. Thus, the lower edges of the flange 10 press against the inclined surfaces 10a of the flange 10 and then pivot the chucking hooks 3 around the pins 3a against the urging forces of the springs 92 to remove the flange 10 from the space between the chucking hooks 3 as shown by reference character I in FIG. 10. When the flange 10 is removed from the space, the chucking hooks 3 are pivoted around the pins 3a by the urging forces of the springs 92.

Figure 1:
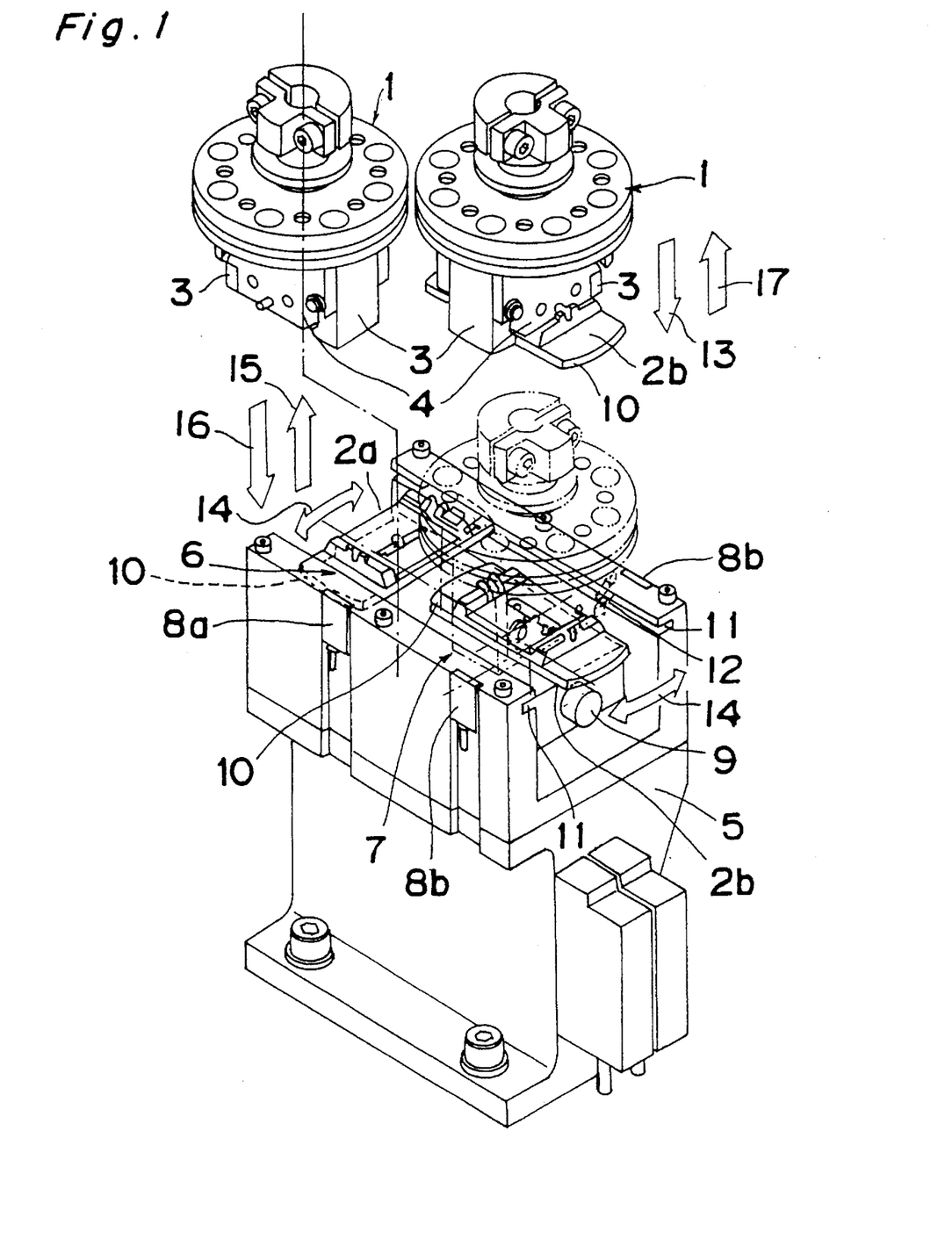
FIG. 1 is a perspective view showing a part of a TCP mounting apparatus in one embodiment of the present invention.
Figure 2:
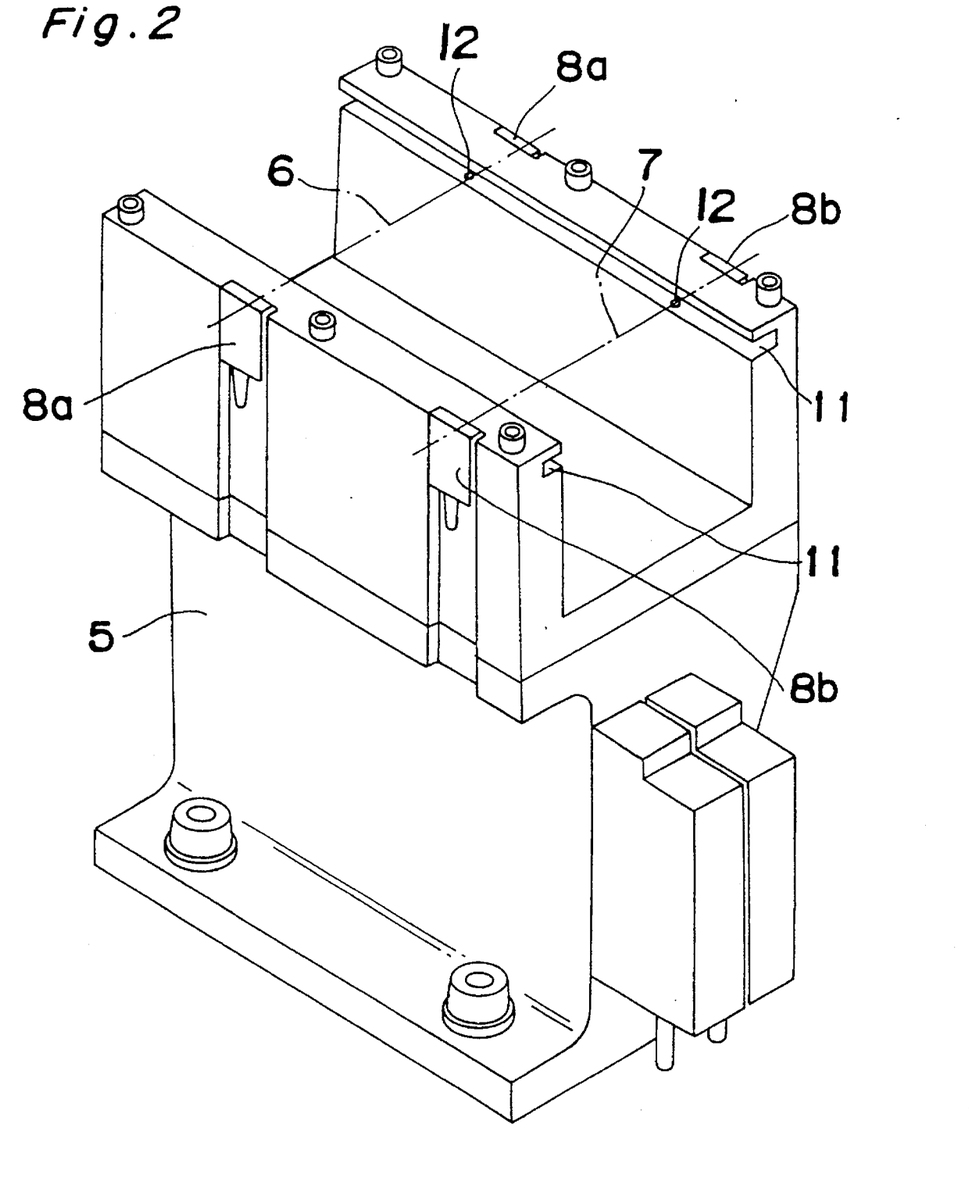
FIG. 2 is a partially enlarged perspective view of a part of the TCP mounting apparatus.

The operation of the head part 1 and station section 5 will be depicted with reference to FIGS. 1 and 2.

In order to remove the first or second bonding tool 2a, 2b held by the head part 1 therefrom and set it at the station section 5, the head part 1 moves to above the station section 5. If the holding tool is the first bonding tool 2a, the head part 1 descends vertically in a direction of an arrow 16 outside the grooves 11 at the side of the first station 6, turns 90° as indicated by an arrow 14, and inserts the flange 10 of the bonding tool 2a into the grooves 11. Then, the head part 1 moves upward vertically in a direction of an arrow 15, thereby opening the chucking hooks 3, so that the bonding tool 2a is released from the head part 1 and left at the bonding tool station 6. If the holding tool is the second bonding tool 2b, the head part 1 moves down vertically in a direction of an arrow 13 outside the grooves 11 at the side of the second tool station 7, turns 90° in the arrow direction 14, and inserts the flange 10 of the bonding tool 2b into the grooves 11. When the head part 1 moves up vertically in a direction of an arrow 17 subsequently, the chucking hooks 3 are opened and the bonding tool 2b is detached from the head part 1 to remain at the bonding tool station 7.

Meanwhile, in order for the head part 1 to take out the first bonding tool 2a from the station section 5, the head part 1 moves to above the station section 5, then descends vertically in the arrow direction 16 at the side of the first station 6. The chucking hooks 3 of the head part 1 clamp the bonding tool 2a, turns 90° in the arrow direction 14, removes the flange 10 of the bonding tool 2a from the grooves 11 of the station 6, and hence separates the bonding tool 2a away from the station 6. Then, in accordance with the upward movement of the head part 1 vertically in the arrow direction 15, the bonding tool 2a is caught by the head part 1.

Meanwhile, in order for the head part 1 to take out the second bonding tool 2b from the station section 5, the head part 1 moves to above the station section 5, then descends vertically in the arrow direction 13 at the side of the second station 7. The chucking hooks 3 of the head part 1 clamp the bonding tool 2b, turns 90° in the arrow direction 14, removes the flange 10 of the bonding tool 2b from the grooves 11 of the station 7, hence separates the bonding tool 2b away from the station 7. Then, in accordance with the upward movement of the head part 1 vertically in the arrow direction 17, the bonding tool 2b is caught by the head part 1.

Figure 7:
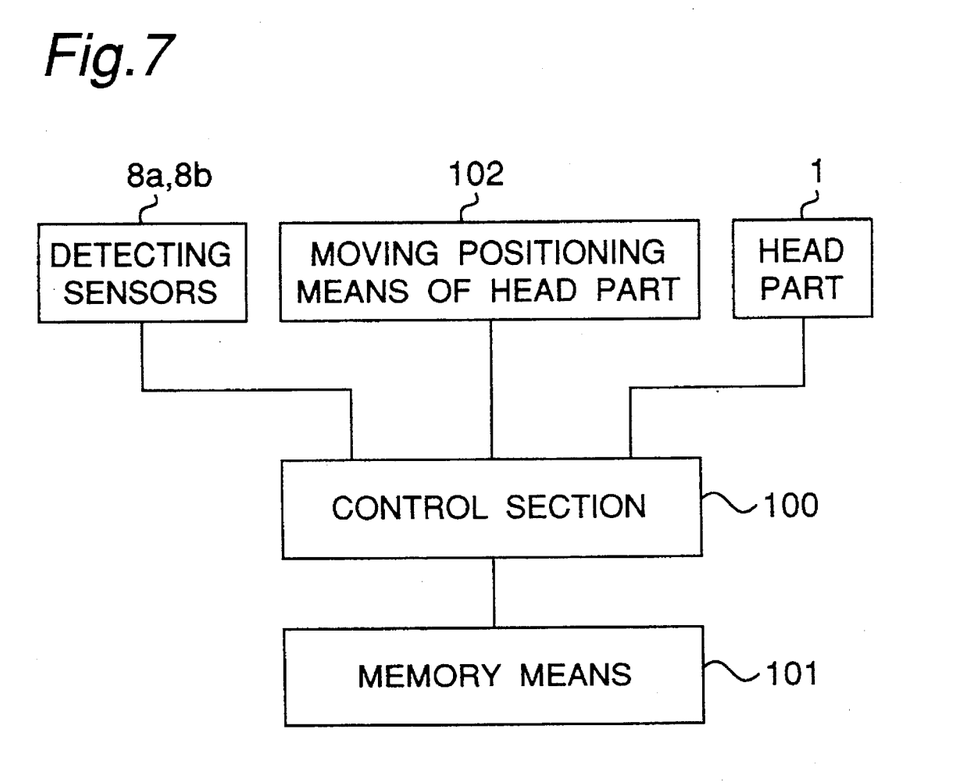
FIG. 7 is a control system of the apparatus in FIG. 1.
Figure 8:
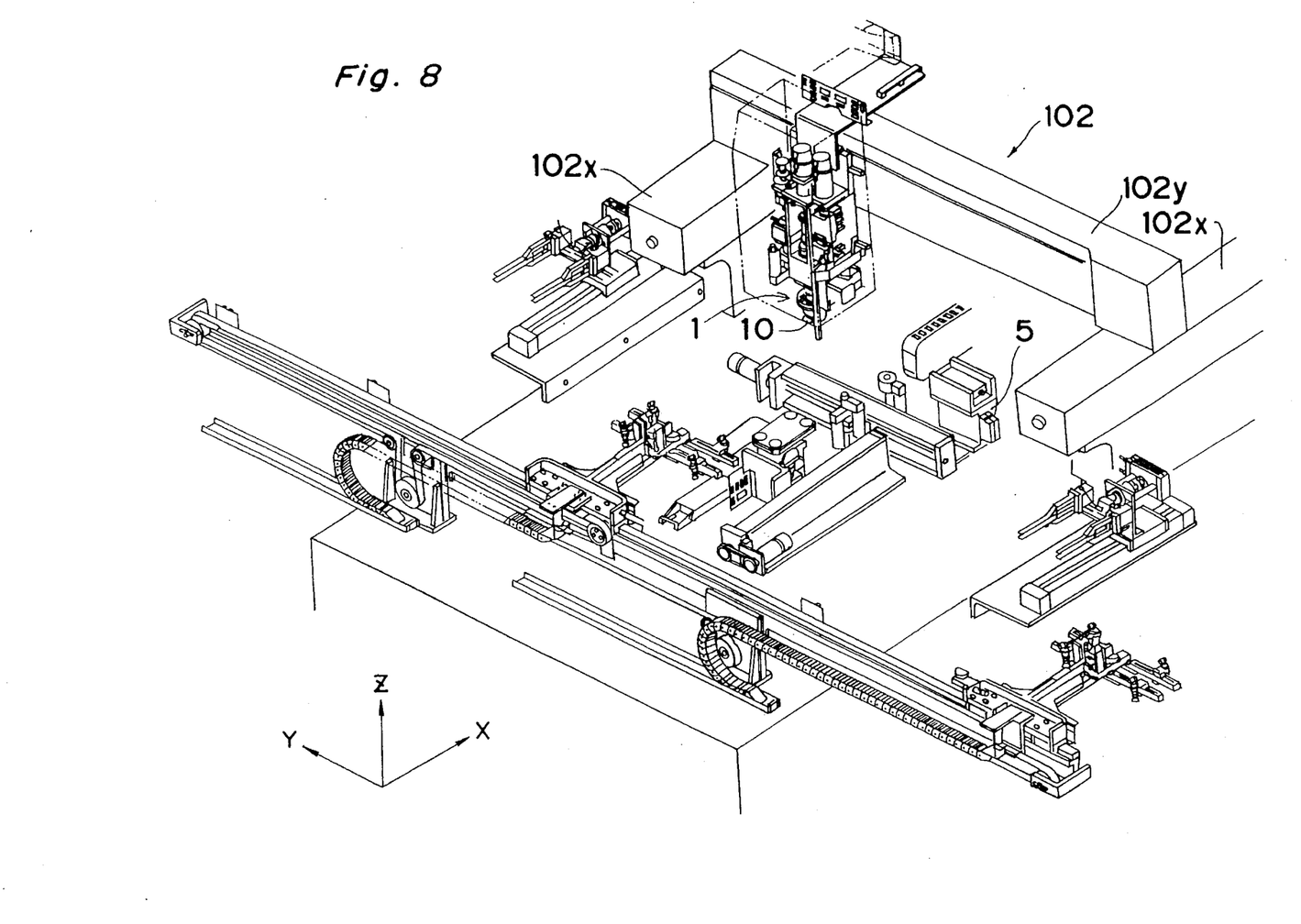
FIG. 8 is a perspective view showing the TCP mounting apparatus in the embodiment.
Figure 9:
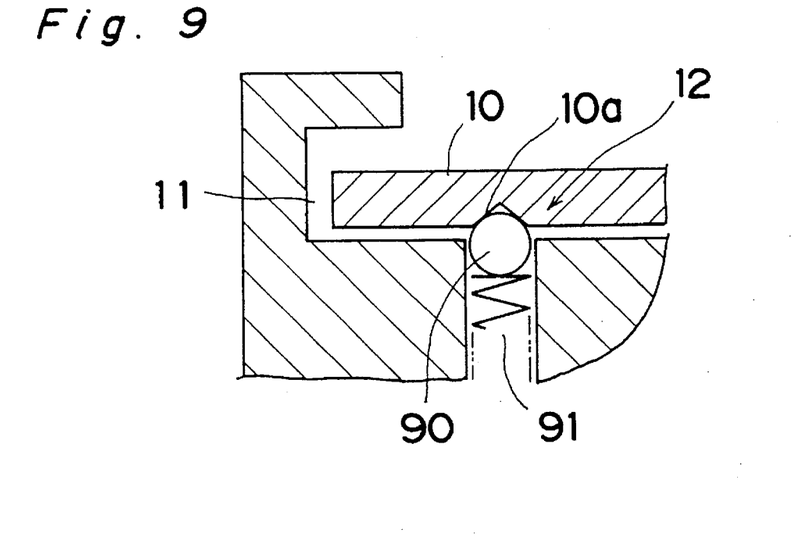
FIG. 9 is a partially sectional view of a ball plunger in the TCP mounting apparatus in the embodiment.

The above-described operation may be performed manually by the operator or automatically conducted by a control section 100 in FIG. 7.

During the automatic operation, the bonding tool stations 6 and 7 that stored the first, second bonding tool 2a, 2b is stored in a memory means 101. Moreover, to what kind of TCPs the first, second bonding tool 2a, 2b is fit is also stored in the memory means 101. The detecting sensors 8a, 8b confirm the presence and absence of the first, second bonding tool 2a, 2b and inform the result to the control section 100. The control section 100 reads out the bonding tool station 6 or 7 storing the bonding tool fit for the to-be-bonded TCP from the data in the memory means 101, and controls the chucking hooks 3 and a moving and positioning means 102 for moving and positioning the head part 1 at a desired position based on the selected tool station 6 or 7. The chucking hooks 3 select and take the first or second bonding tool 2a or 2b fit for the to-be-bonded TCP out from the tool station 6 or 7, so that the TCP is bonded with heat and pressure to a liquid crystal panel while using the taken-out bonding tool. After the bonding of the TCP, the taken-out bonding tool 2a or 2b is returned to the tool station 6 or 7. The head part 1 connected with the control section 100 in FIG. 7 means that operations of mechanical parts and an actuator unit of the head part 1 and rotation thereof are controlled by the control section 100. The upward and downward operations and X-Y axes movement of the head part 1 are driven by the moving positioning means 102. One example of the moving positioning means 102 is an X-Y robot 102 shown in FIG. 8. The robot includes a Y-axis driving part 102y holding the head part 1 is supported by a pair of X-axis driving part 102x, so that the head part 1 is driven in the Y direction by the Y-axis driving part 102y and also driven in the X direction by the X-axis driving parts 102x. The head part 1 can move in the Z direction with respect to the Y-axis driving part 102y.

Any of the head part, bonding tools, changing and holding means, storing and holding section, etc. may be freely designed to conform to the purpose, and is not limited to the aforementioned embodiment.

As described hereinabove, while a plurality of kinds of bonding tools suitable to mount TCPs of specific shapes are usable in the mounting apparatus of the present invention, the bonding tools are exchanged and set to one head part at the using time, making it unnecessary to exchange the head part whose parallelism is hard to regulate. Even though the bonding tool is exchanged for mounting a different type of TCPs, the regulation of the parallelism of the bonding tool is also eliminated simply by enhancing the size accuracy of the bonding tool and the exchanging and holding means.

Since the storing and holding section for waiting bonding tools can have a heating means, the waiting bonding tools are kept at the bonding temperature at all times, and enabled to promptly start bonding after the exchange.

Without the increase in weight, the head part is moved at high speeds, contributing to the improvement of productivity.

In the TCP mounting apparatus of the invention, the memory means stores necessary reference data. When a different kind of TCPs are desired, the control section reads necessary data from the memory means and issues an instruction to the head part based on the data. The head part selects the instructed bonding tool out from the storing and holding section. Therefore, the TCP mounting apparatus allows even a variety of TCPs to be mounted to a liquid crystal panel in a single equipment with high productivity while using bonding tools that are exchanged in accordance with an instruction from the control section.

That is, since the mounting apparatus is provided with an automatic mechanism for the head part to select and change the bonding tool from the storing and holding section in accordance with instructions from the control section, various kinds of TCPs can be bonded with heat and pressure to a liquid crystal panel with good productivity while the bonding tool being used is automatically selected in a single equipment.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A TCP mounting apparatus comprising:

a tool storing and holding section having arranged therein a plurality of different kinds of bonding tools for detachably engaging respective tape carrier packages of different shapes and then heat and pressure bonding the tape carrier packages to a liquid crystal panel, said bonding tools being stored at respective predetermined positions within the tool storing and holding section, said tool storing and holding section including a first heater which heats said bonding tools stored at the respective predetermined positions, and a detection device which detects a presence and absence of each of said bonding tools stored at the respective predetermined positions;

a head part which detachably engages any selected one of said bonding tools to extract and then return said any selected one of said bonding tools from and to the respective predetermined positions within said tool storing and holding section, said head part including a second heater which heats a bonding tool engaged by said head part; and a conveyor mechanism which moves and positions the head part relative to the respective predetermined positions within said tool storing and holding section.

2. The TCP mounting apparatus according to claim 1, further comprising:

a memory for storing reference data indicative of the plurality of different kinds of bonding tools and the respective tape carrier packages, and further indicative of the predetermined positions of said bonding tools within said tool storing and holding section; and a control section which reads out from the reference data a one of the predetermined positions containing a bonding tool which is to be used for a to-be-bonded tape carrier package, and then controls said conveyor mechanism and said head part to extract said bonding tool from the read-out one of the predetermined positions, to heat and pressure bond the to-be-bonded tape carrier package to the liquid crystal panel using the extracted bonding tool, and to return the extracted bonding tool to the read-out one of the predetermined positions upon completion of the heat and pressure bonding of the to-be-bonded tape carrier package.

* * * * *